United States Patent
Joshi et al.

(10) Patent No.: US 12,207,405 B2
(45) Date of Patent: Jan. 21, 2025

(54) BEVELED OVERBURDEN FOR VIAS AND METHOD OF MAKING THE SAME

(71) Applicant: CORNING INCORPORATED, Corning, NY (US)

(72) Inventors: Dhananjay Joshi, Painted Post, NY (US); Chukwudi Azubuike Okoro, Painted Post, NY (US); Scott Christopher Pollard, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 153 days.

(21) Appl. No.: 17/923,624

(22) PCT Filed: Apr. 29, 2021

(86) PCT No.: PCT/US2021/029776
§ 371 (c)(1),
(2) Date: Nov. 7, 2022

(87) PCT Pub. No.: WO2021/225850
PCT Pub. Date: Nov. 11, 2021

(65) Prior Publication Data
US 2023/0380062 A1 Nov. 23, 2023

Related U.S. Application Data

(60) Provisional application No. 63/021,891, filed on May 8, 2020.

(51) Int. Cl.
*H05K 1/11* (2006.01)
*H05K 1/03* (2006.01)
(Continued)

(52) U.S. Cl.
CPC ........... *H05K 1/116* (2013.01); *H05K 1/0306* (2013.01); *H05K 3/064* (2013.01); *H05K 3/42* (2013.01);
(Continued)

(58) Field of Classification Search
CPC ......... H05K 1/116; H05K 1/0306; H05K 3/42
See application file for complete search history.

(56) References Cited

U.S. PATENT DOCUMENTS

| | | | |
|---|---|---|---|
| 2011/0012266 A1* | 1/2011 | Horiuchi | H01L 23/49833 257/773 |
| 2019/0312067 A1 | 10/2019 | Garner et al. | |
| 2019/0394887 A1 | 12/2019 | Vinson et al. | |

FOREIGN PATENT DOCUMENTS

| | | |
|---|---|---|
| JP | 2011-254050 A | 12/2011 |
| KR | 10-2016-0084689 A | 7/2016 |
| WO | 2019/199677 A2 | 10/2019 |

OTHER PUBLICATIONS

International Search Report and Written Opinion of the International Searching Authority; PCT/US2021/029776 Mailed on Aug. 17, 2021, 8 pages; Korean Patent Office.

* cited by examiner

*Primary Examiner* — Jeremy C Norris
(74) *Attorney, Agent, or Firm* — Ryan T. Hardee; Grant A. Gildehaus

(57) ABSTRACT

A substrate including a via with a beveled overburden is disclosed. The substrate can include a substrate having a first surface, a second surface opposite the first surface, and a via passing from the first surface to the second surface. The via can be coated with a metallic layer that includes a first beveled overburden on the first surface, and the first beveled overburden can include a first outer edge that forms a first bevel angle greater than 95° with the first surface. The (Continued)

substrate can include a second beveled overburden that includes a second outer edge that forms a second bevel angle greater than 95° with the second surface. Methods of making the beveled overburdens are also disclosed.

18 Claims, 19 Drawing Sheets

(51) Int. Cl.
*H05K 3/06* (2006.01)
*H05K 3/42* (2006.01)

(52) U.S. Cl.
CPC ................ *H05K 2201/0215* (2013.01); *H05K 2201/068* (2013.01); *H05K 2201/09154* (2013.01); *H05K 2201/09509* (2013.01); *H05K 2201/09827* (2013.01); *H05K 2201/09845* (2013.01)

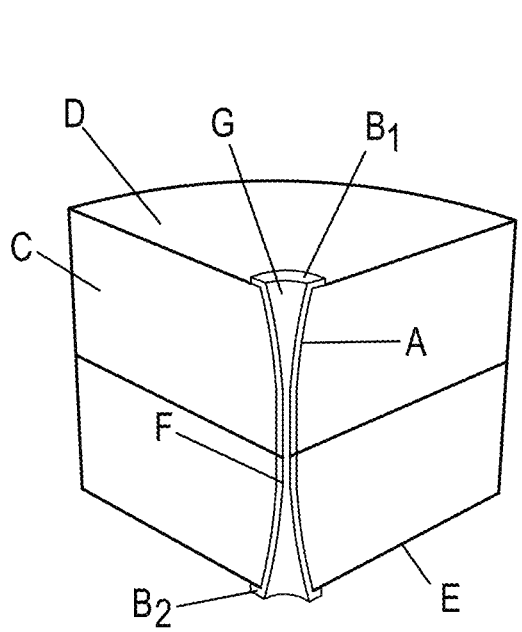
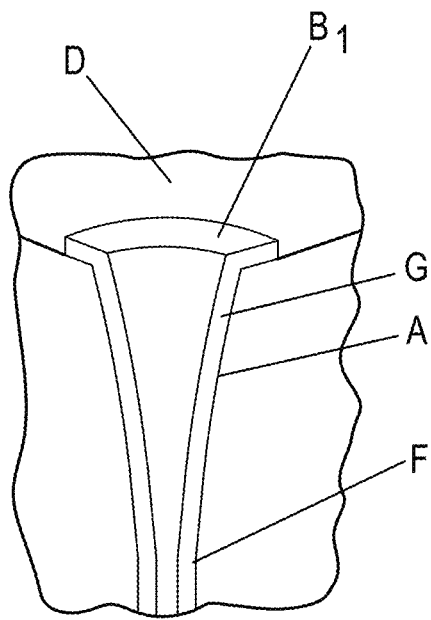
FIG. 3A
(Prior Art)
FIG. 3B
(Prior Art)
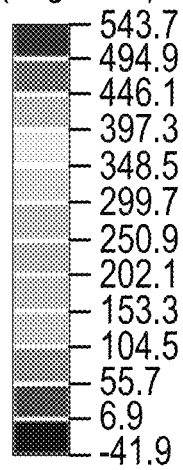
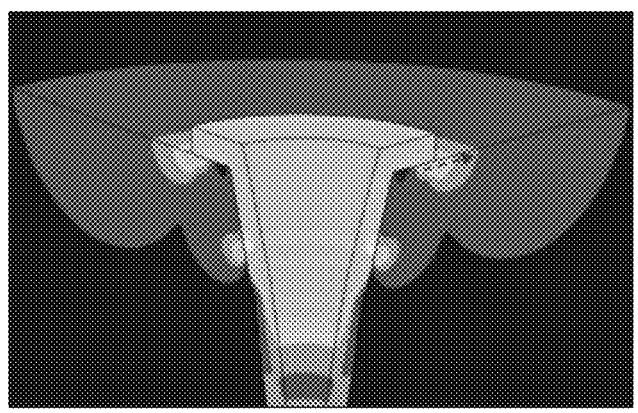
FIG. 4

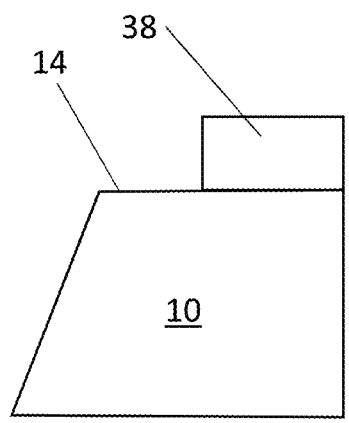
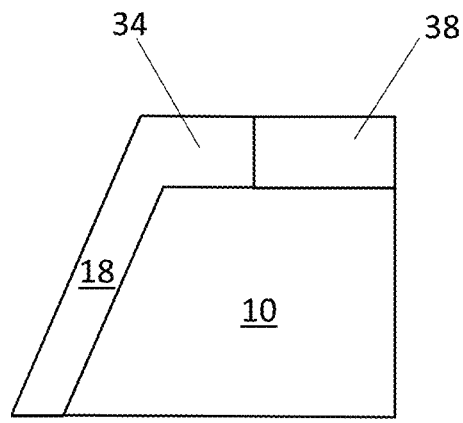
FIG. 16A  FIG. 16B
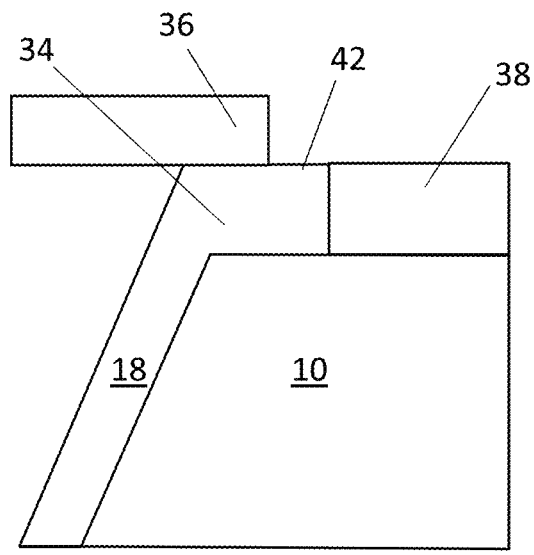
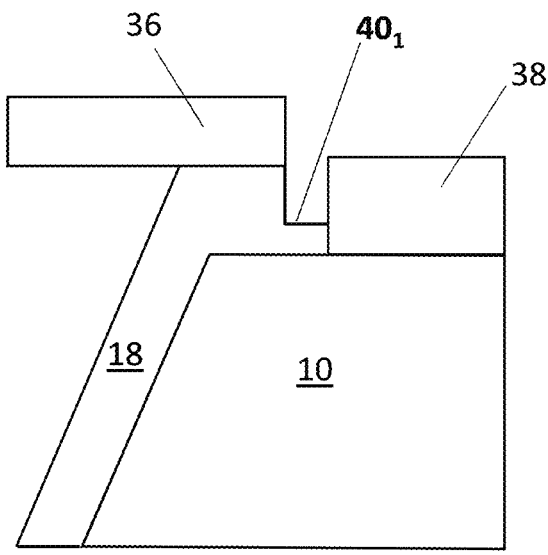
FIG. 17A  FIG. 17B

BEVELED OVERBURDEN FOR VIAS AND METHOD OF MAKING THE SAME

CROSS-REFERENCE TO RELATED APPLICATION

This application is a national stage entry of International Patent Application Serial No. PCT/US2021/029776, filed on Apr. 29, 2021, which in turn, claims the benefit of priority under 35 U.S.C. § 119 of U.S. Provisional Application Ser. No. 63/021,891 filed on May 8, 2020, the contents of each of which are relied upon and incorporated herein by reference in their entireties.

BACKGROUND

Field

The present disclosure relates generally to metallic coatings for through-hole vias. More particularly, it relates to metallic coatings for through-hole vias that exhibit reduced stress on the substrate.

Technical Background

Integrated circuits (IC) frequently include vias in order to conduct electricity from one layer or surface of the IC to another layer or surface. This requires the formation of a metallic layer coating both pads and the barrel of the via. As an example, metallization of a through-hole via can be achieved by electroplating using copper. After vias have been formed in the substrate, adhesion and seed layers are deposited. This is followed by the dipping of the substrate into an electroplating bath, which leads to the metallization of the vias as well as a complete coating of both surfaces of the substrate with the metallization material. The coating on the upper and lower surfaces of the substrate are often called copper overburden. This conventional way of electroplating is expensive because a thick copper overburden is both where it is desired and even on the unwanted areas. This leads to the use of excess copper, which increases the cost of producing the IC. Additionally, removal of the thick copper overburden requires an extensive chemical-mechanical-polishing (CMP) step, which significantly increases the production cost of substrates with metallized vias. However, the presence of copper overburden during annealing is known to lead to reduced substrate (e.g., glass) stresses, thus, reducing the likelihood of crack formation in the substrate.

In order to reduce the cost of a metallized substrate, one used method for limiting the presence of copper overburden is the deposition of photoresists on the substrate, in regions where copper overburden is not desired. Patterned overburden reduces time and cost of metallizing vias. Limiting the deposition of copper overburden to the areas immediately around the via openings is referred to as patterned overburden. Examples of conventional patterned overburden are shown in FIGS. 2, 3A, and 3B.

SUMMARY

In some embodiments of the present disclosure, a substrate comprising a via with a beveled overburden is disclosed. The substrate includes a first surface, a second surface opposite the first surface, and a via passing from the first surface to the second surface, where a metallic layer coats the via. The metallic layer can include a first beveled overburden on the first surface and the first beveled overburden can include a first outer edge that can form a first bevel angle greater than 95° with the first surface.

In some embodiments, the metallic layer can also include a second beveled overburden on the second surface and the second beveled overburden can include a second outer edge that can form a second bevel angle greater than 95° with the second surface.

In other embodiments of the present disclosure, a method of forming a via with a beveled overburden is described. The method can include providing a substrate comprising a via, and forming a metallic layer with a first beveled overburden on the via. The first beveled overburden can be over a first surface of the substrate. The first beveled overburden comprises a first outer edge that forms a first bevel angle greater than 95° with the first surface.

In some embodiments, the metallic layer can also include a second beveled overburden over a second surface of the substrate, and the second beveled overburden can include a second outer edge that can form a second bevel angle greater than 95° with the second surface.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary and are intended to provide an overview or framework to understanding the nature and character of the claims. The accompanying drawings are included to provide a further understanding and are incorporated in and constitute a part of this specification. The drawings illustrate one or more embodiment(s), and together with the description explain principles and operation of the various embodiments.

BRIEF DESCRIPTION OF THE DRAWINGS

FIG. 3A is a three-dimensional cross-section of a quadrant of a pinched, hour-glass shaped via coated with a metallic layer having a prior art patterned overburden.

FIG. 3B is a close-up of the prior art first patterned overburden of FIG. 3A.

FIG. 4 is a three-dimensional graph of the stresses applied to the substrate by a metallic coating by a prior art patterned overburden as shown in FIG. 3B.

FIG. 16A is a cross-sectional view of an outer photoresist applied around a via, while FIG. 16B is the cross-sectional view of FIG. 16A after an initial overburden has been deposited.

FIG. 17A is a cross-sectional view of an inner and outer photoresist with an etching surface exposed, while FIG. 17B is the cross-sectional view of FIG. 17A after the etching surface has been etched to form a step.

FIG. 18A is a cross-sectional view of an inner and outer photoresist with an etching surface exposed, while

FIG. 21A is a cross-sectional view of an outer photoresist applied around a via, while

FIG. 22A is a cross-sectional view of an inner and outer photoresist with a deposition surface exposed, while

FIG. 23A is a cross-sectional view of an inner and outer photoresist with a deposition surface exposed, while

DETAILED DESCRIPTION

Figure 1:
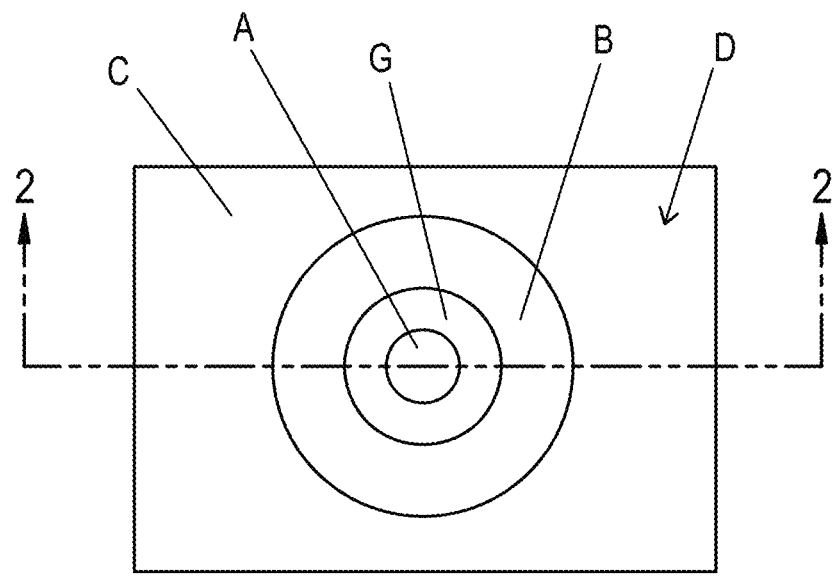
FIG. 1 is top view of a via coated with a metallic layer having a prior art patterned overburden.
Figure 2:
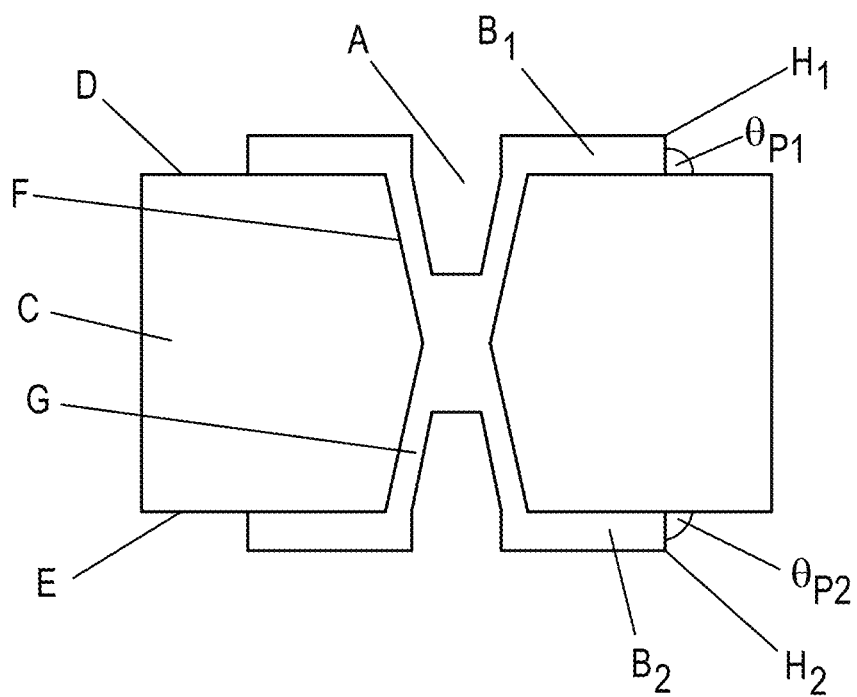
FIG. 2 is an example of a cross-sectional view of a prior art via with a patterned overburden taken along cut line 2-2 of FIG. 1.

Reference will now be made in detail to embodiments of the present disclosure, examples of which are illustrated in the accompanying drawings. Whenever possible, the same reference numerals will be used throughout the drawings to refer to the same or like parts. However, this disclosure may be embodied in many different forms and should not be construed as limited to the embodiments set forth herein.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom, vertical, horizontal—are made only with reference to the figures as drawn and are not intended to imply absolute orientation.

Unless otherwise expressly stated, it is in no way intended that any method set forth herein be construed as requiring that its steps be performed in a specific order, nor that with any apparatus, specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an," and "the" include plural references unless the context clearly dictates otherwise. Thus, for example, reference to "a" component includes aspects having two or more such components, unless the context clearly indicates otherwise.

Conventionally, metallization of vias produced in a full metal overburden on the surfaces at opposite ends of the via. Because this resulted in a waste of expensive metal (e.g., copper) and increased manufacturing costs associated with removal of the metal, alternatives were desired. As a result, manufactures began using a photoresist to prevent metal from being deposited on portions of the substrate where the metal was not necessary. Localization of the overburden is referenced as patterned overburden.

An example of a via (A) that has been metallized with a conventional patterned overburden (B) is shown in FIGS. 1, 2, 3A, and 3B. The substrate (C) has a first surface (D) and a second surface (E) with the barrel (F) of the via (A) extending form the first surface (D) to the second surface (E). The metal layer (G) coats the barrel (F) and includes a first patterned overburden ($B_1$) extending onto the first surface (D) and a second patterned overburden ($B_2$) extending onto the second surface (E). As can be seen, a first overburden outer edge ($H_1$) of the first overburden ($B_1$) forms a 90° angle ($\theta_{P1}$) with the first surface (D) and a second overburden outer edge ($H_2$) of the second overburden ($B_2$) forms a 90° angle ($\theta_{P2}$) with the second surface (E).

While a patterned overburden solves a number of problems related to waste and efficiency, it has been discovered that a patterned overburden also creates some issues. For example, for the same copper overburden thickness, much more stress is exerted on the substrate during annealing for substrates with a patterned overburden than substrates with a non-patterned overburden. It was hypothesized that this increase in the near surface stresses occurs because of the abrupt end of the patterned Cu overburden, which presents significant reliability issues including crack propagation in the substrate, as well as, delamination of the metal from the substrate.

It has been discovered that compared to a conventional patterned overburden, a beveled overburden can reduce the stresses exerted on the substrate during annealing. In some instances, the chances of cracking during annealing can be reduced by approximately 50%. This issue can be particularly problematic for substrates including, but not limited to, glass, ceramic, and glass-ceramics.

In some embodiments, a substrate 10 comprising a via 12 with a beveled overburden is disclosed. The substrate 10 can include a first surface 14, a second surface 16 opposite the first surface 14, and a via 12 passing from the first surface 14 to the second surface 16. A metallic layer 18 can coat the via 12 and include a first beveled overburden 20 on the first surface 14. The first beveled overburden 20 can include a first outer edge 22.

In some embodiments, the first outer edge 22 forms a first bevel angle ($\theta_1$) greater than 95° with the first surface 14. In some embodiments, the first bevel angle ($\theta_1$) is 105° or greater. In some embodiments, the first bevel angle ($\theta_1$) is 120° or greater. In some embodiments, the first bevel angle ($\theta_1$) is 125° or greater, or 130° or greater, 135° or greater, or 140° or greater.

In some embodiments, a maximum thickness ($OB_{T1}$) of the first beveled overburden 20 is less than 50 microns. In some embodiments, a maximum thickness ($OB_{T1}$) of the first beveled overburden 20 is 40 microns or less, or 30 microns or less, or 25 microns or less, or 20 microns or less, or 17.5 microns or less, or 15 microns or less, or 12.5 microns or less, or 10 microns or less, or 7.5 microns or less, or 5 microns or less, or 2.5 microns or less.

In some embodiments, the metallic layer 18 includes a metal selected from the group consisting of copper, aluminum, and tungsten. In some embodiments, the metallic layer 18 includes copper. In some embodiments, the metallic layer 18 is copper.

In some embodiments, a length ($OB_{L1}$) of the first beveled overburden 20 on the first surface 14 is less than 500 microns. In some embodiments, a length ($OB_{L1}$) of the first beveled overburden 20 on the first surface 14 is less than 400 microns, or less than 300 microns, or less than 200 microns, or less than 100 microns, or less than 75 microns, or less than 50 microns, or less than 40 microns, or less than 35 microns, or less than 30 microns, or less than 25 microns.

As used herein, the length of the overburden is measured along the interface of the overburden and the surface over which it is deposited. For example, the length of the overburden in FIG. 6 is 20 microns. Overburden length is also shown in FIG. 5B.

Figure 5A:
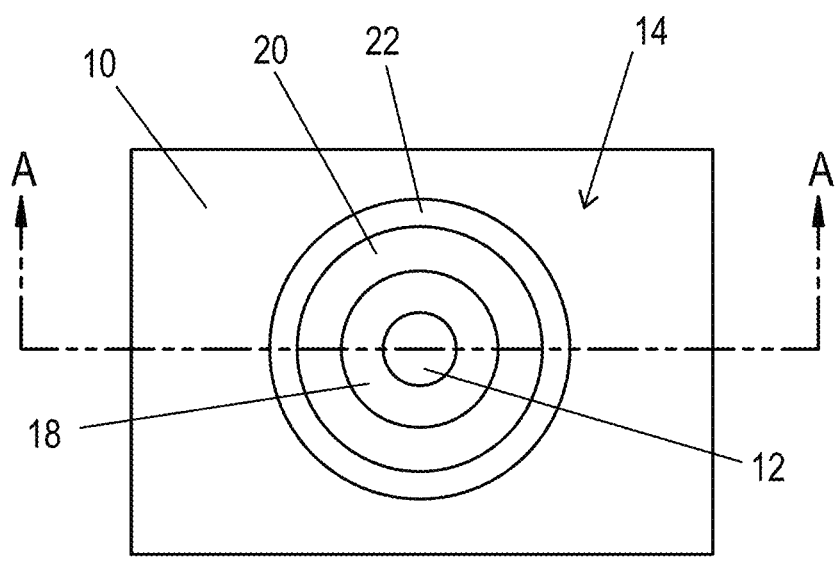
FIG. 5A is top view of a via coated with a metallic layer having a linear, beveled overburden as described herein.
Figure 5B:
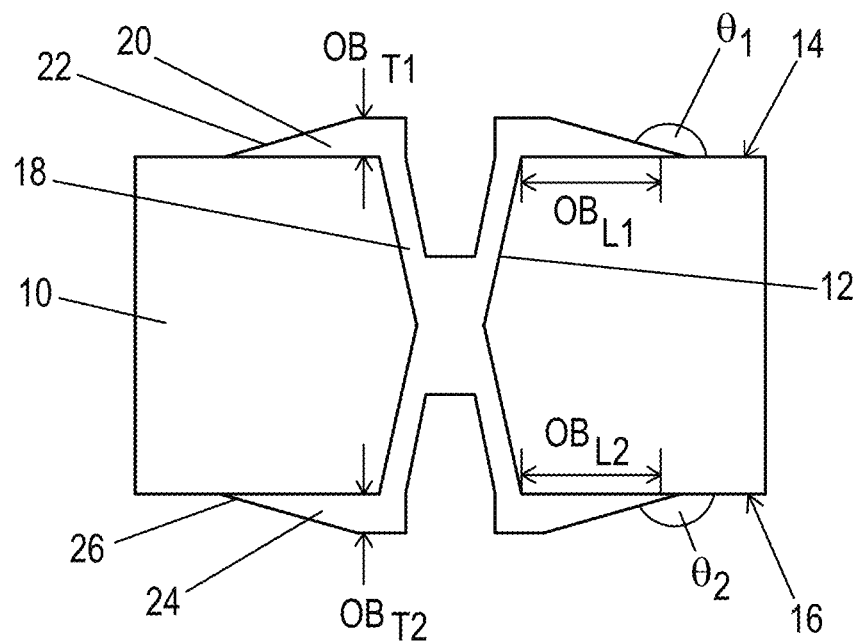
FIG. 5B is an example of a cross-sectional view of a linear, beveled overburden as described herein taken along cut line A-A of FIG. 5A.
Figure 6:
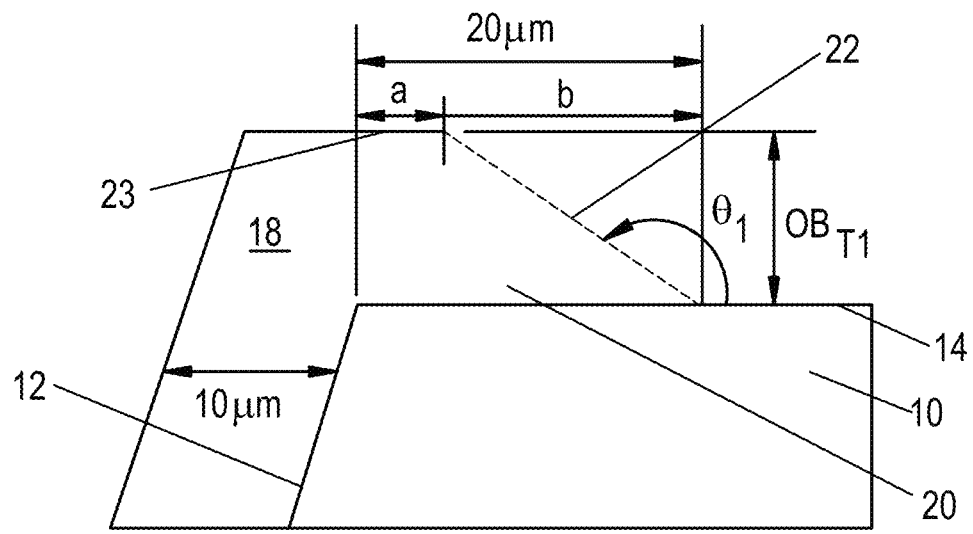
FIG. 6 is a cross-sectional view of a patterned overburden, showing the dimensions and parameters used to determine the bevel angle of a beveled overburden as described herein.
Figure 7A:
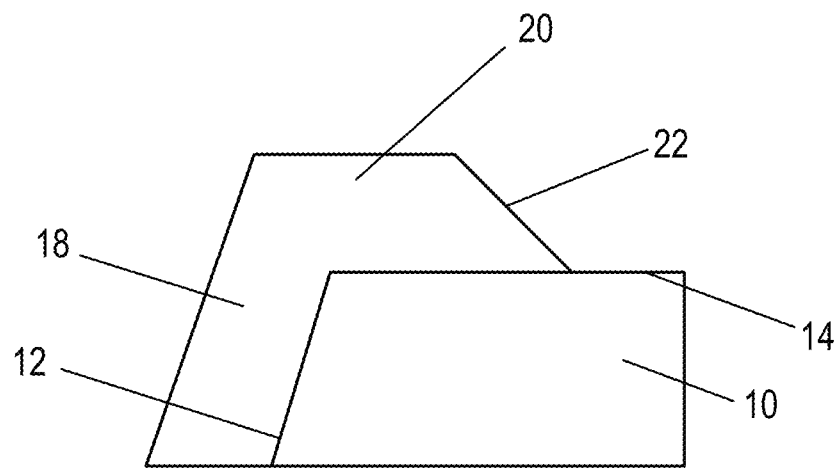
FIG. 7A is a cross-sectional view of a linear beveled overburden.
Figure 7B:
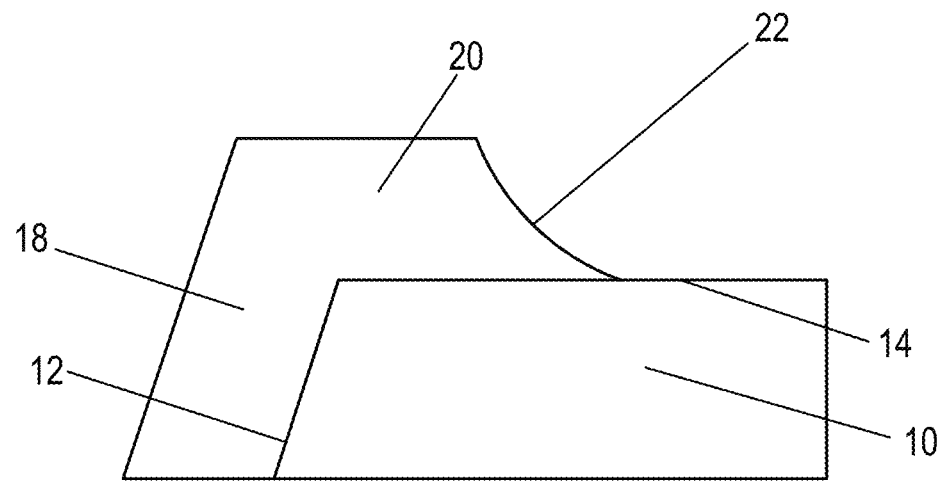
FIG. 7B is a cross-sectional view of a concave beveled overburden with a relatively steep slope.
Figure 7C:
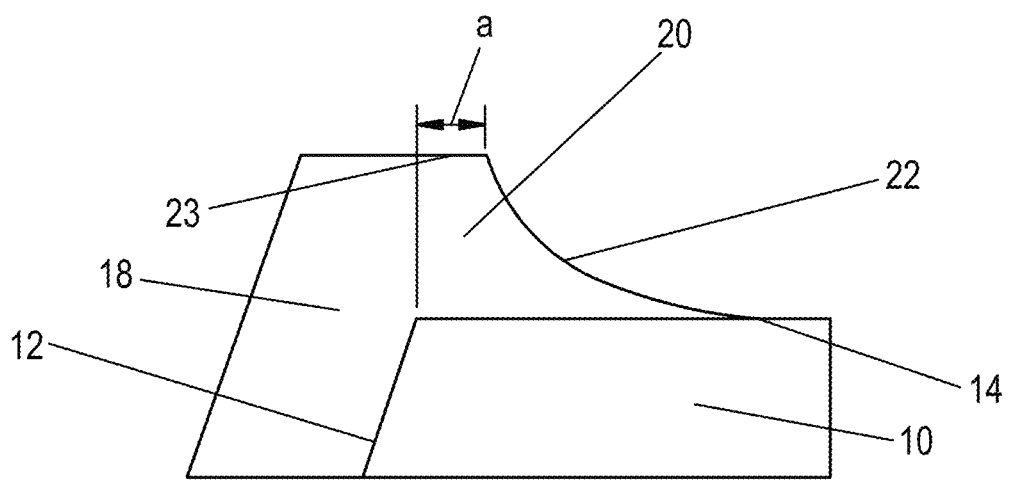
FIG. 7C is a cross-sectional view of a concave beveled overburden with a less steep slope than the concave bevel shown in FIG. 7B.
Figure 19:
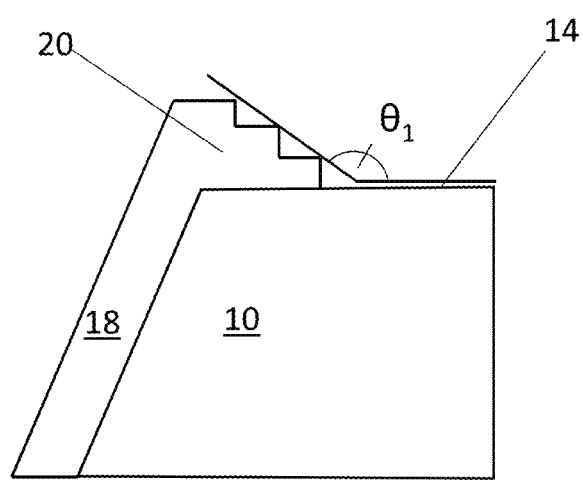
FIG. 19 is a cross-sectional view of a beveled edge formed using a subtractive method.
Figure 24:
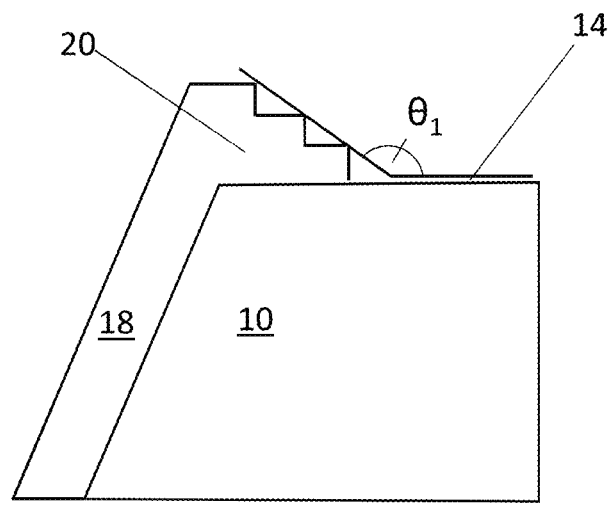
FIG. 24 is a cross-sectional view of a beveled edge formed using a subtractive method.

In some embodiments, as shown in FIGS. 5A, 5B, and 7A, the first outer edge 22 comprises a linear bevel. In some embodiments, as shown in FIGS. 19 and 24, the first outer edge 22 comprises a stepped bevel. In some embodiments, as shown in FIGS. 7B and 7C, the first outer edge 22 comprises a concave bevel.

In some embodiments, the substrate 10 includes a material selected from glass, glass-ceramic, ceramic, silicon, quartz, sapphire and combinations thereof.

In some embodiments, the coefficient of thermal expansion (CTE) of the substrate is less than or equal to $10e^{-6}$/°C.

In some embodiments, the via 12 is selected from the group consisting of a through-hole via, a blind via, and a buried via.

In some embodiments, the via 12 has a form selected from the group consisting of hour-glass, tapered, and cylindrical.

Figure 25:
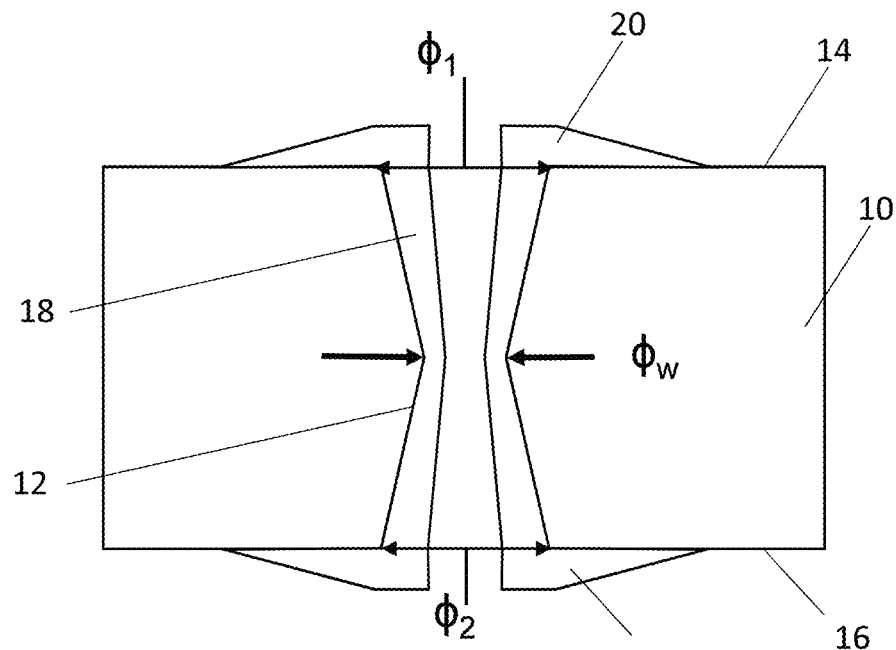
FIG. 25 is a cross-sectional view of an hour-glass shaped via with a conformal metallic layer.
Figure 27:
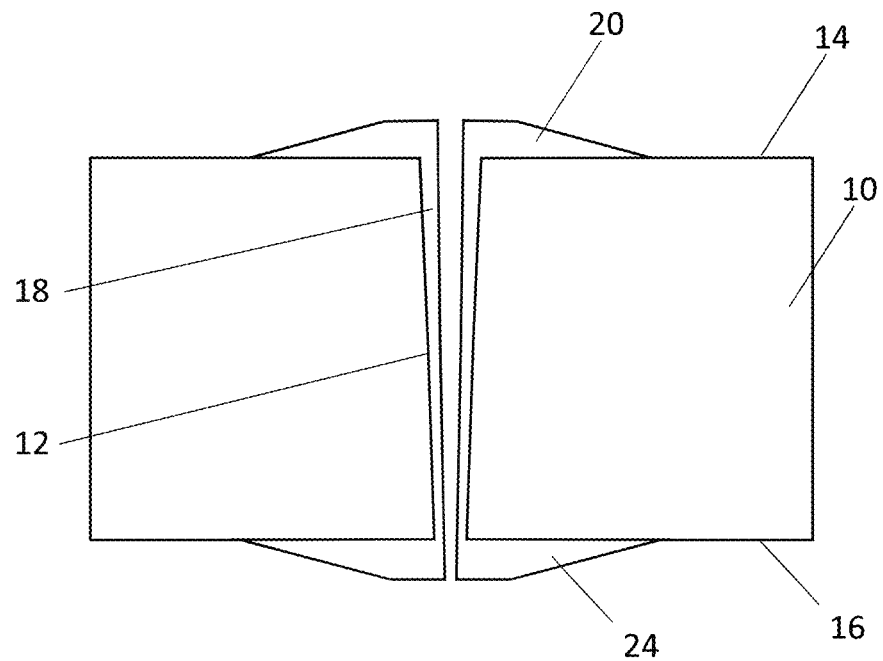
FIG. 27 is a cross-sectional view of a tapered via with a conformal metallic layer.
Figure 28:
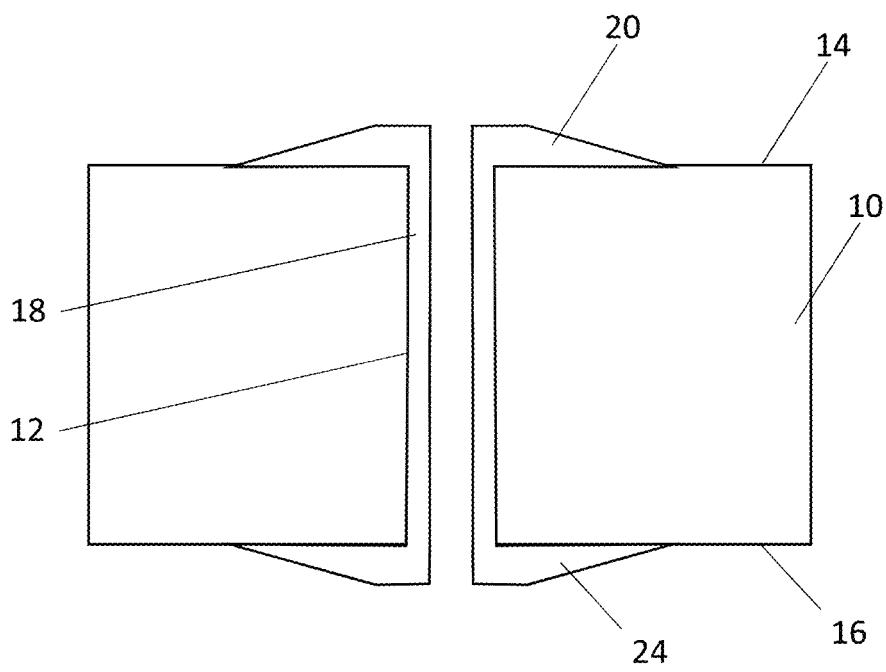
FIG. 28 is a cross-sectional view of a cylindrical via with a conformal metallic layer.

In some embodiments, as shown in FIGS. 25, 27, and 28, the metallic layer 18 is conformal in the via 12.

Figure 26:
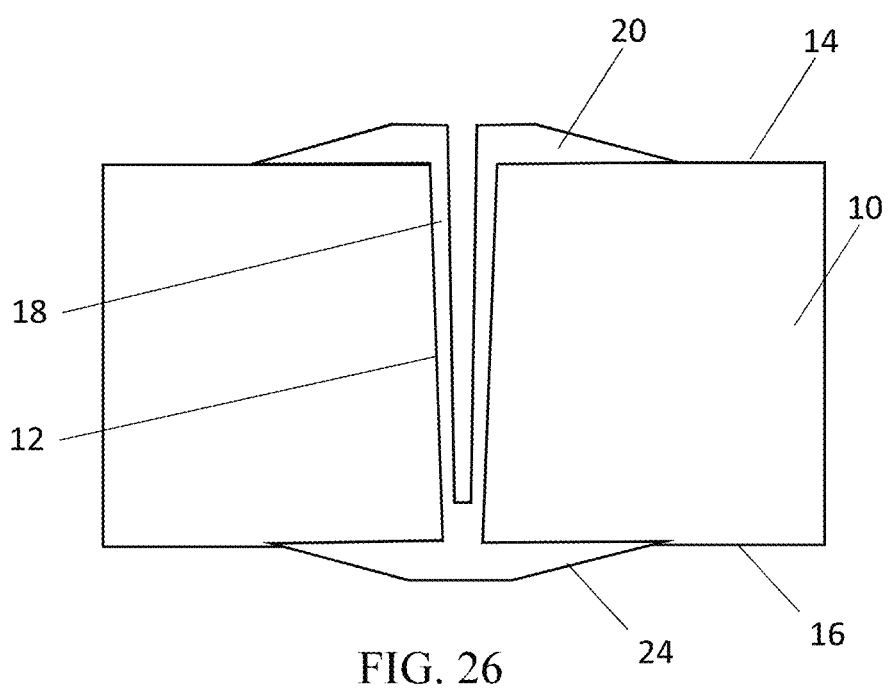
FIG. 26 is a cross-sectional view of a tapered via with a pinched metallic layer.

In some embodiments, as shown in FIGS. 5B and 26, the metallic layer 18 is pinched (i.e., a portion of the metallic layer bridges across the via) in the via 12.

Figure 29:
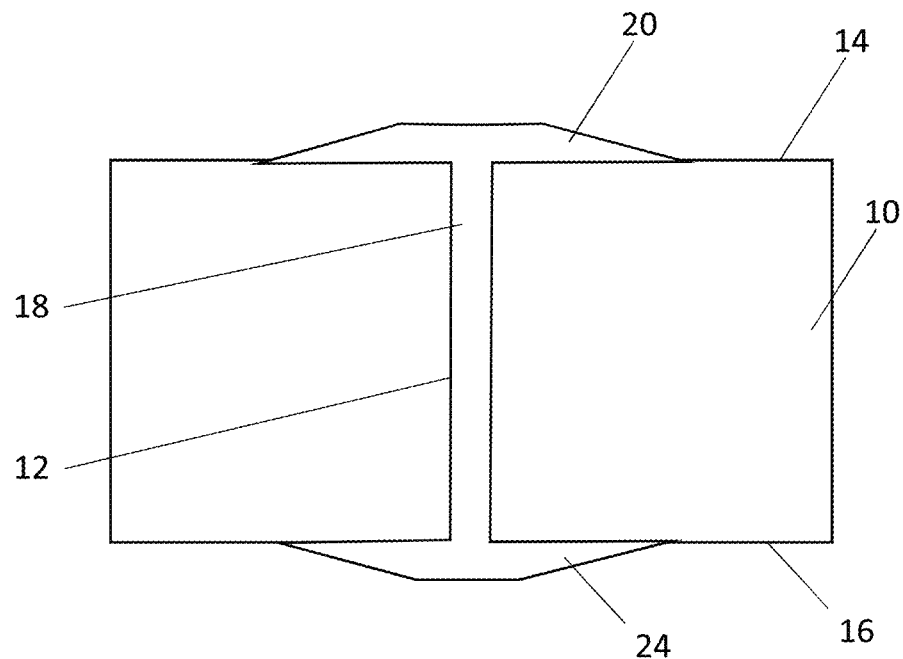
FIG. 29 is a cross-sectional view of a cylindrical via that is fully filled with a metallic layer.
Figure 30:
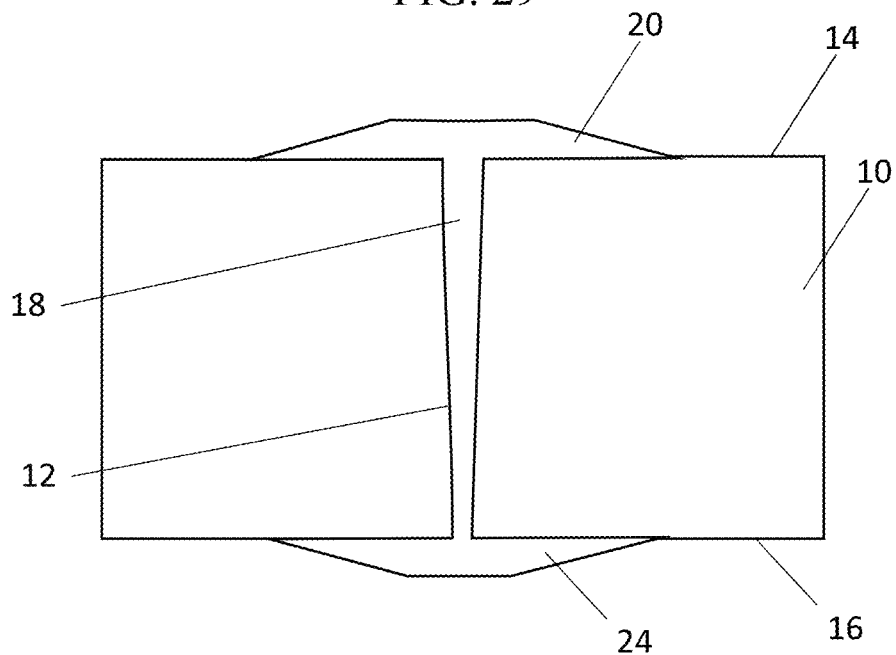
FIG. 30 is a cross-sectional view of a tapered via that is fully filled with a metallic layer.
Figure 31:
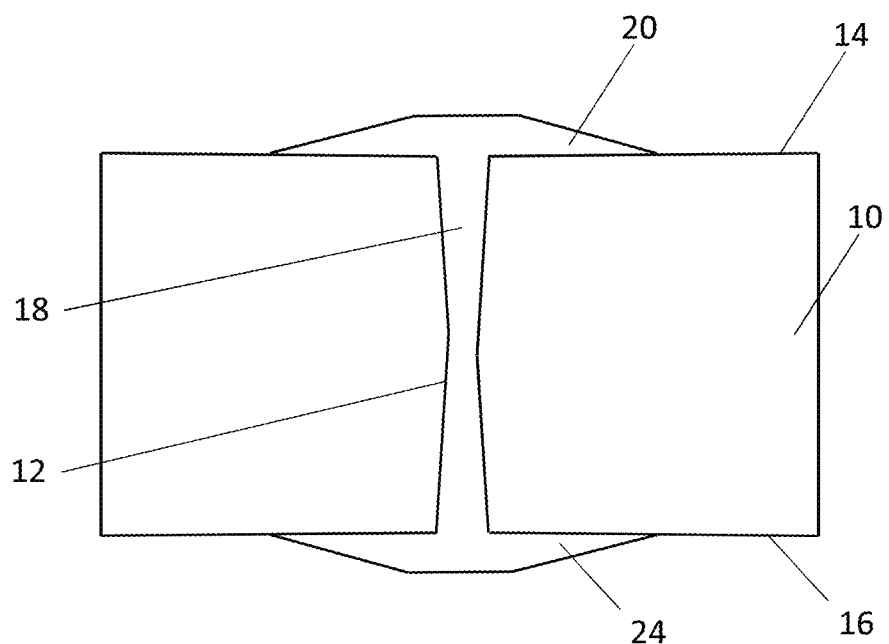
FIG. 31 is a cross-sectional view of an hour-glass shaped via that is fully filled with a metallic layer.

In some embodiments, as shown in FIGS. 29-31, the metallic layer 18 fills the via 1.

In some embodiments, a diameter ($\phi_1$) of the via 12 at the first surface 14 is less than or equal to 25 microns. In some embodiments, a diameter ($\phi_2$) of the via 12 at the second surface 16 is less than or equal to 25 microns. In some such embodiments, the via is filled by the metallic layer.

In some embodiments, as shown in FIGS. 28 and 29, the via 12 is cylindrical and the diameter ($\phi_1$) at the first surface 14 is the same as the diameter ($\phi_2$) at the second surface 16, and the diameter ($\phi_w$) at the middle (or waist) 13 of the via 12.

In some embodiments, as shown in FIGS. 26, 27, and 30, the via 12 is tapered and the diameter ($\phi_1$) at the first surface 14 is greater than the diameter ($\phi_w$) at the middle (or waist) 13, which is greater than the diameter ($\phi_2$) at the second surface 16.

In some embodiments, as shown in FIGS. 5B, 25 and 31, the via 12 is hour-glass shaped and the diameter ($\phi_1$) at the first surface 14 is the same as the diameter ($\phi_2$) at the second surface 16, and the diameter ($\phi_w$) at the middle (or waist) 13 is less than the diameters ($\phi_1$, $\phi_2$) at the first surface and the second surface.

In some embodiments, the metallic layer 18 comprises a second beveled overburden 24 on the second surface 16 and the second beveled overburden 24 comprises second outer edge 26.

In some embodiments, the second outer edge 26 forms a second bevel angle ($\theta_2$) greater than 95° with the second surface 16. In some embodiments, the second bevel angle ($\theta_2$) is 105° or greater. In some embodiments, the second bevel angle ($\theta_2$) is 120° or greater. In some embodiments, the second bevel angle ($\theta_2$) is 125° or greater, or 130° or greater, 135° or greater, or 140° or greater.

In some embodiments, a maximum thickness ($OB_{T2}$) of the second beveled overburden 24 is less than 50 microns. In some embodiments, a maximum thickness ($OB_{T2}$) of the second beveled overburden 24 is 50 microns or less, or 40 microns or less, or 30 microns or less, or 25 microns or less, or 20 microns or less, or 17.5 microns or less, or 15 microns or less, or 12.5 microns or less, or 10 microns or less, or 7.5 microns or less, or 5 microns or less, or 2.5 microns or less.

In some embodiments, the maximum thickness ($OB_{T1}$) of the first beveled overburden 20 is less than 50 microns and a maximum thickness ($OB_{T2}$) of the second beveled overburden 24 is less than 50 microns. In some embodiments, the maximum thickness ($OB_{T1}$) of the first beveled overburden 20 and the maximum thickness ($OB_{T2}$) of the second beveled overburden 24 are both 40 microns or less, or 30 microns or less, or 25 microns or less, or 20 microns or less, or 17.5 microns or less, or 15 microns or less, or 12.5 microns or less, or 10 microns or less, or 7.5 microns or less, or 5 microns or less, or 2.5 microns or less.

In some embodiments, the length ($OB_{L1}$) of the first beveled overburden 20 is less than 500 microns and the length ($OB_{L2}$) of the second beveled overburden 24 is less than 500 microns. In some embodiments, the length ($OB_{L1}$) of the first beveled overburden 20 and the length ($OB_{L2}$) of the second beveled overburden 24 are both less than 400 microns, or less than 300 microns, or less than 200 microns, or less than 100 microns, or less than 75 microns, or less than 50 microns, or less than 40 microns, or less than 35 microns, or less than 30 microns, or less than 25 microns.

In some embodiments, the substrate including the metallic layer with at least a first beveled overburden exhibits a lower probability of crack formation when heated to temperatures less than or equal to 600° C. than the substrate including an equivalent metallic layer with a patterned overburden. In some embodiments, the substrate including the metallic layer with at least a first beveled overburden exhibits a lower probability of crack formation when heated to temperatures ranging from 400° C. to 600° C. than the substrate including an equivalent metallic layer with a patterned overburden. As used herein, an equivalent metallic layer refers to a metallic layer having the same thickness and an overburden with the same length on a substrate surface(s).

In some embodiments, the probability of crack formation of a substrate with a metallic layer including at least a first beveled overburden when heated to temperatures less than or equal to 600° C. is reduced at least 5% absolute, or at least 10% absolute, or at least 15% absolute, or at least 20% absolute, or at least 25% absolute compared to the substrate with an equivalent metallic layer with a patterned overburden. In some embodiments, the probability of crack formation of a substrate with a metallic layer including at least a first beveled overburden when heated to temperatures ranging from 400° C. to 600° C. is reduced at least 5% absolute, or at least 10% absolute, or at least 15% absolute, or at least 20% absolute, or at least 25% absolute compared to the substrate with an equivalent metallic layer with a patterned overburden.

In some embodiments, the probability of crack formation of a substrate with a metallic layer including at least a first beveled overburden heated to temperatures less than or equal to 600° C. is reduced at least 5%, or at least 10%, or at least 15%, or at least 20%, or at least 25% relative to the likelihood of crack formation of the substrate having a comparable metallic layer. In some embodiments, the probability of crack formation of a substrate with a metallic layer including at least a first beveled overburden heated to temperatures ranging from 400° C. to 600° C. is reduced at least 5%, or at least 10%, or at least 15%, or at least 20%, or at least 25% relative to the likelihood of crack formation of the substrate having a comparable metallic layer.

In some embodiments, as shown in FIGS. 6 and 7C, a length (a) of the first lateral overburden surface 23 of the first beveled overburden is at least 1.0 micron. In some embodiments, a length (a) of the first lateral overburden surface 23 of the first beveled overburden is at least 1.5 microns, or at least 2.0 microns, or at least 2.5 microns, or at least 3.0 microns, or at least 3.5 microns. As used herein, the lateral overburden surface refers to the portion of the upper surface of the beveled overburden that extends radially outward from the outer edge of the via 12 prior to the beveled portion (i.e., the outer edge).

In some embodiments, a length (a) of the second lateral overburden surface of the second beveled overburden is at least 1.0 micron. In some embodiments, a length (a) of the second lateral overburden surface is at least 1.5 microns, or at least 2.0 microns, or at least 2.5 microns, or at least 3.0 microns, or at least 3.5 microns.

In some embodiments, at least one of the first outer edge 22 and the second outer edge 26 comprise a linear bevel. In some embodiments, both the first outer edge 22 and the second outer edge 26 include a linear bevel.

In some embodiments, at least one of the first outer edge 22 and the second outer edge 26 include a stepped bevel. In some embodiments, both the first outer edge 22 and the second outer edge 26 include a stepped bevel.

In some embodiments, at least one of the first outer edge 22 and the second outer edge 26 comprise a concave bevel. In some embodiments, both the first outer edge 22 and the second outer edge 26 include a concave bevel.

Figure 11:
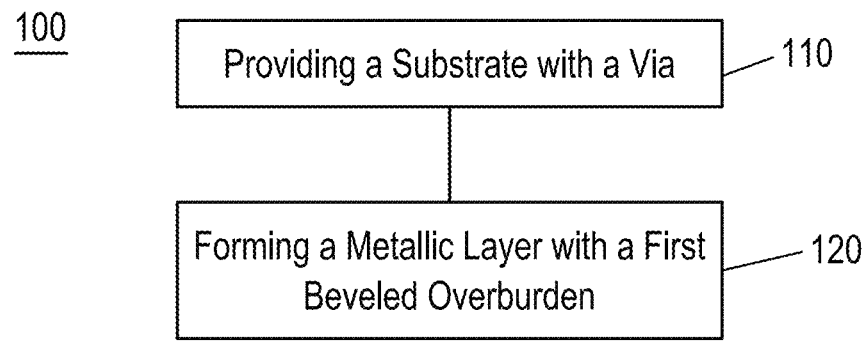
FIG. 11 is a flow chart of a method for forming a metallic layer with a beveled overburden.

In another embodiment, as shown in FIG. 11, a method 100 of depositing a beveled overburden 20, 24 on a via. The method 100 can include the step 110 of providing a substrate comprising a via, and then the step 120 of forming a metallic layer 18 with a first beveled overburden 20 on the via 120. In some embodiments, the first beveled overburden 20 is over the first surface 14. In some embodiments, the first beveled overburden 20 includes a first outer edge 22 that forms a first bevel angle ($\theta_1$) greater than 95° with the first surface 14.

Figure 12:
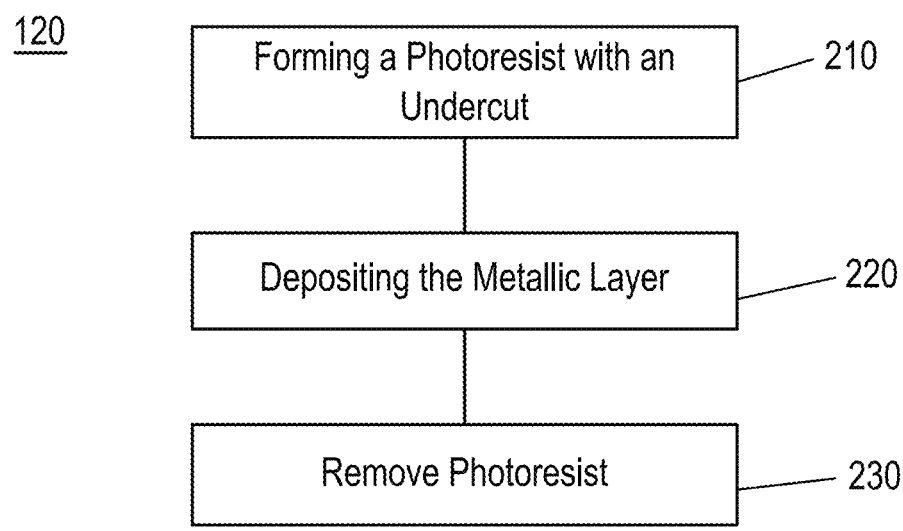
FIG. 12 is a flow chart of a method for forming a metallic layer with a beveled overburden using a photoresist with an undercut.

In some embodiments, as shown in FIG. 12, the depositing step 120 can include a step 210 of forming a photoresist mask 28 with an undercut over the first surface 14, then a step 220 of depositing the metallic layer 18 on the via 12 and exposed portions of the first surface 14. In some embodiments, the method includes the step 230 of removing the photoresist mask 28.

Figure 13:
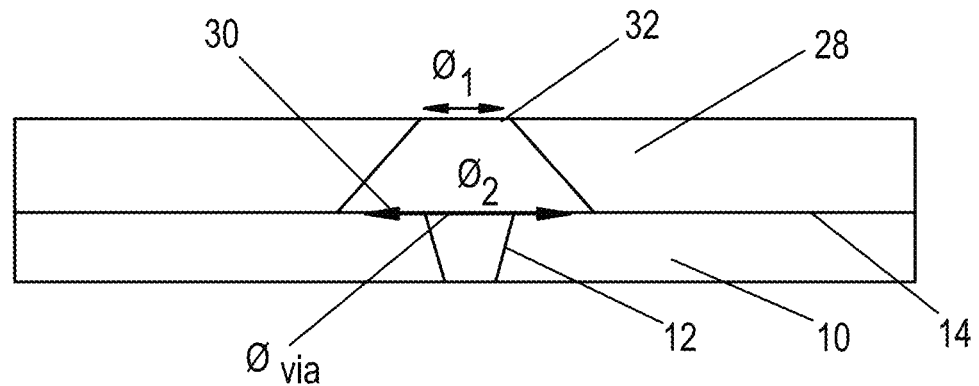
FIG. 13 is a cross-sectional view of a photoresist with a linear undercut applied on a surface containing via.
Figure 14:
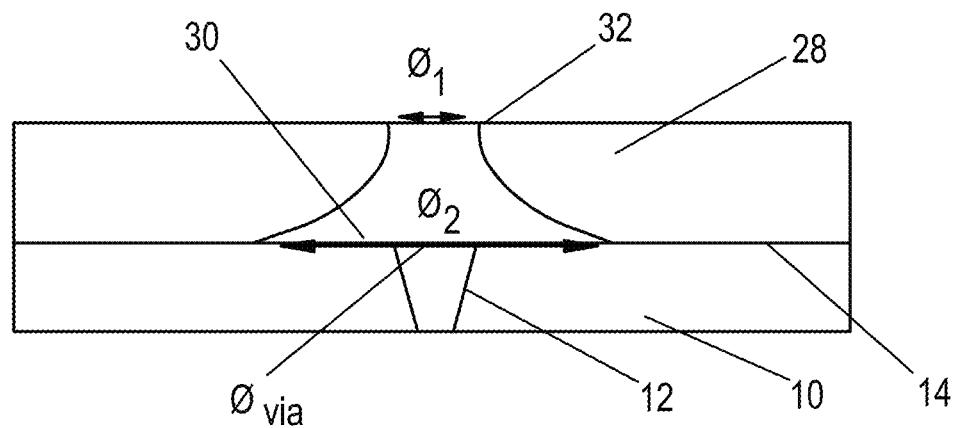
FIG. 14 is a cross-sectional view of a photoresist with a convex undercut (i.e., for forming a concave beveled overburden) applied on a surface containing via.

As used herein, an undercut refers to a photoresist mask 28 with an lower opening 30 that is larger than the upper opening 32. For example, as shown in FIGS. 13 and 14, if the lower opening 30 and the upper opening 32 are both circular, the lower opening diameter ($\varnothing_2$) can be larger than the upper opening diameter ($\varnothing_1$). In some such embodiments, as shown in FIGS. 13 and 14, the lower opening 30 and the via 12 can be concentric, the upper opening 32 and the via 12 can be concentric, or each of the lower opening 30, the upper opening 32, and the via 12 can be concentric.

In some embodiments, as shown in FIG. 13, the photoresist mask 28 can include a linear undercut, which will cause the first outer edge 22 to have a linear bevel. In some embodiments, as shown in FIG. 14, the photoresist mask 28 can include a convex undercut, which will cause the first outer edge 22 to have a concave bevel.

In some embodiments, a photoresist mask 28 lower opening diameter ($\varnothing_2$) is greater than the maximum via diameter ($\varnothing_{via}$). In some embodiments, a photoresist mask 28 upper opening diameter ($\varnothing_1$) is greater than the maximum via diameter ($\varnothing_{via}$). In some embodiments, both the lower opening diameter ($\varnothing_2$) and the upper opening diameter ($\varnothing_1$) are greater than the maximum via diameter ($\varnothing_{via}$).

An undercut can be achieved by direct laser exposure/machining or exposure of negative photoresist. In the negative photoresist process, the top side of the photoresist layer is strongly irradiated due to absorption, while the lower side of the photoresist layer is not strongly irradiated. This leads to a highly cross-linked top side of the resist, with a minimally cross-linked lower side. Because of this different in crosslinking, the developer etches away the photoresist more rapidly as the developed move down into the photoresist. This results in creating a hole with a smaller top side diameter ($\varnothing_1$) and a larger bottom side diameter ($\varnothing_2$) as shown in FIGS. 13 and 14.

In some embodiments, the method includes forming a photoresist mask 28 with an undercut over the second surface 16, then depositing the metallic layer 18 on the via 12 and exposed portions of the second surface 16. In some embodiments, a first photoresist mask 28 with an undercut is formed on the first surface 14, a second photoresist mask 28 with an undercut is formed on the second surface 16, then the metallic layer 18 is deposited on the via 12 and exposed portions of the first surface 14 and the second surface 16.

In some embodiments, as shown in FIGS. 15-19, a subtractive method is used for forming a first beveled overburden 20 having a stepped bevel. In some such embodiments, the forming step 120 comprises a step 310 of depositing an initial overburden 34 a step 320 of forming an inner photoresist 36 and an outer photoresist 38, then a step 330 of etching a portion of the initial overburden 34 to form a step $40_1$. The forming step 320 and etching step 330 can be repeated in order to form multiple steps $40_1$, $40_2$, $40_3$, etc.

An example of depositing step 310 is shown by FIGS. 16A and 16B. FIG. 16A shows one side of a cross-sectional view of a via 12 with an outer photoresist 38 formed, while FIG. 16B shows the same cross-sectional view after the initial overburden 34 has been deposited.

FIG. 17A shows step 320 where an inner photoresist 36 has been formed on the initial overburden 34 and an outer photoresist 38 is formed to expose an etching surface 42. In this instance, the outer photoresist 38 can be the same photoresist used in step 310 or can be formed following step 310. In step 330, as shown in FIG. 17B, the etching surface 42 can be etched to form a step having a thickness less than the thickness of the initial overburden 34. In some embodiments, the thickness of the step $40_n$ is greater than a thickness of the overburden radially outward of the step $40_n$. For the first step $40_1$, the thickness of the overburden radially outward of the step $40_1$ is generally 0. For subsequent steps, the thickness of each step $40_n$ is greater than the next step $40_{n-1}$.

In decision step 340, a decision is made whether to form another step or complete the subtractive beveling process. If additional steps $40_{n+1}$ are desired, then the step 320 of forming inner and outer photoresists 36, 38 and the step 330 of etching the etching surface 42 are repeated. If additional steps are not desired, the step 350 of removing the inner photoresist 36 and outer photoresist 38 are executed.

Figure 18A:
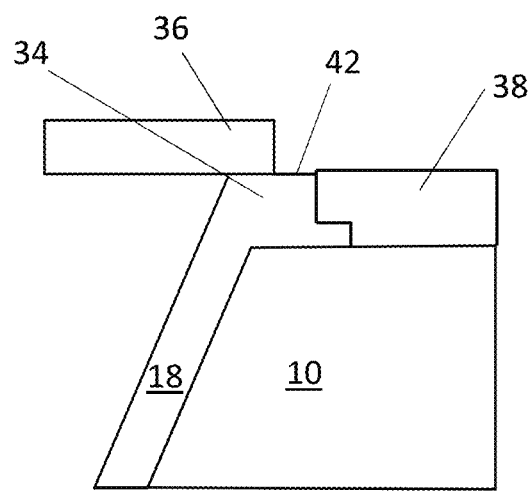
Figure 18B:
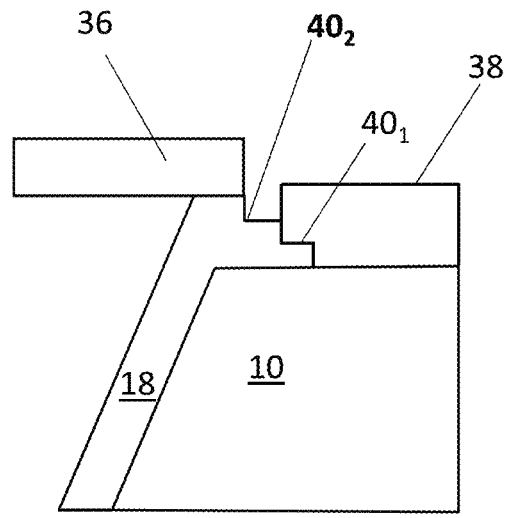
FIG. 18B is the cross-sectional view of FIG. 18A after the etching surface has been etched to form a subsequent step.

FIG. 18A shows the second iteration of step 320 with an inner photoresist 36 and an outer photoresist 38 exposing a second etching surface 42. FIG. 18B shows that the etching surface 42 has been etched to form a second step $40_2$ with a thickness between the thickness of the first step $40_1$ and the thickness of the overburden 20.

Figure 15:
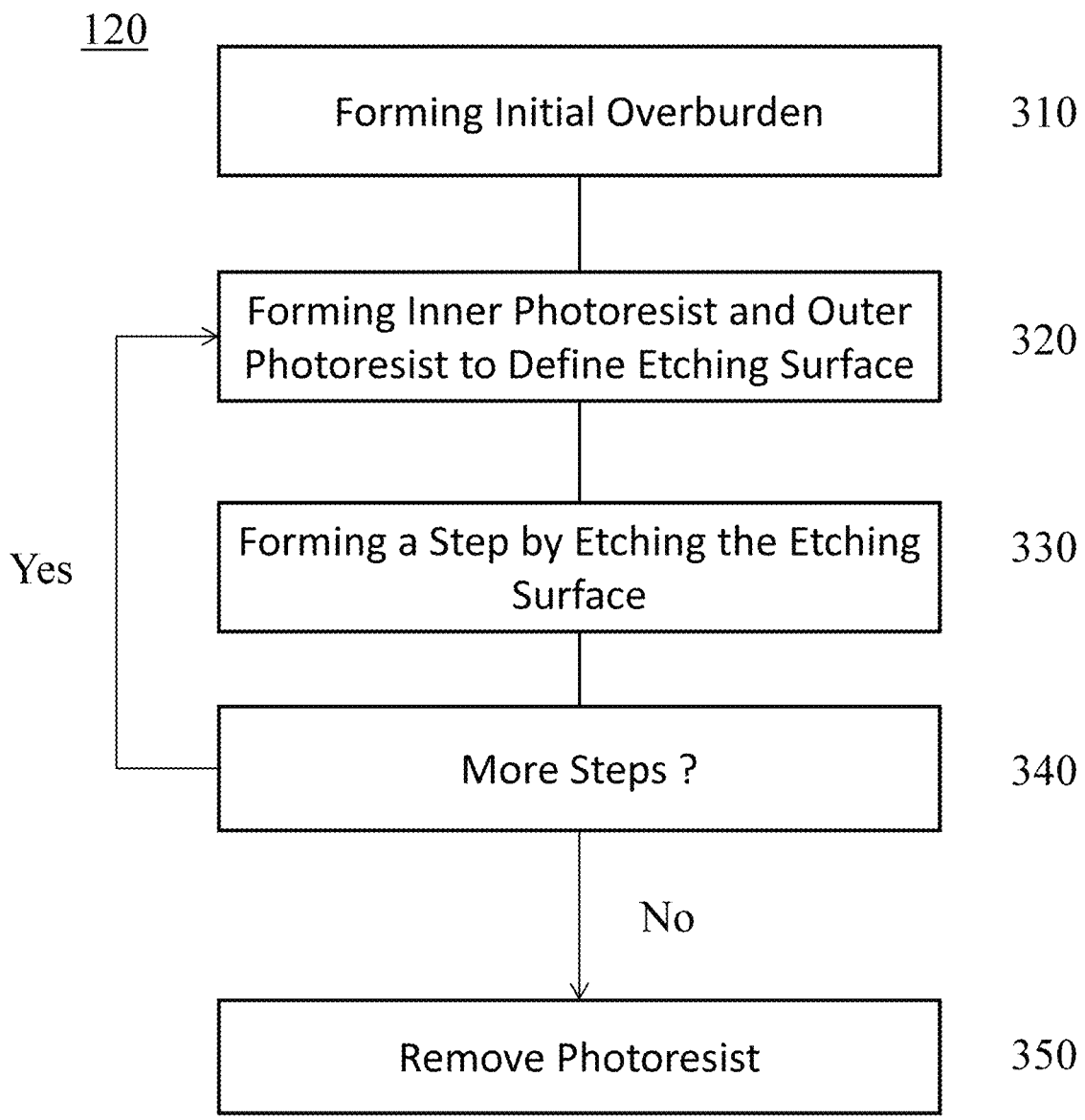
FIG. 15 is a flow chart of a subtractive method for forming a metallic layer with a stepped beveled overburden.

FIG. 19 shows an example of a first beveled overburden 20 produced using the subtractive method of FIG. 15.

In some embodiments, the subtractive method of FIG. 15 can be performed on the second surface 16 of the substrate 10 to form the second beveled overburden 24. In some embodiments, the subtractive method is performed on the first surface 14 and the second surfaces 16 in parallel to form the first beveled overburden 20 and the second beveled overburden 24, simultaneously.

In some embodiments, as shown in FIGS. 20 and 21-24, an additive method is used for forming a first beveled overburden 20 having a stepped bevel. In some embodiments, as shown in FIG. 21A, an outer photoresist 38 can be formed around the via 12. As shown in FIG. 21B, an initial metallic layer 44 can be formed over a portion of the first surface 14.

Figure 22A:
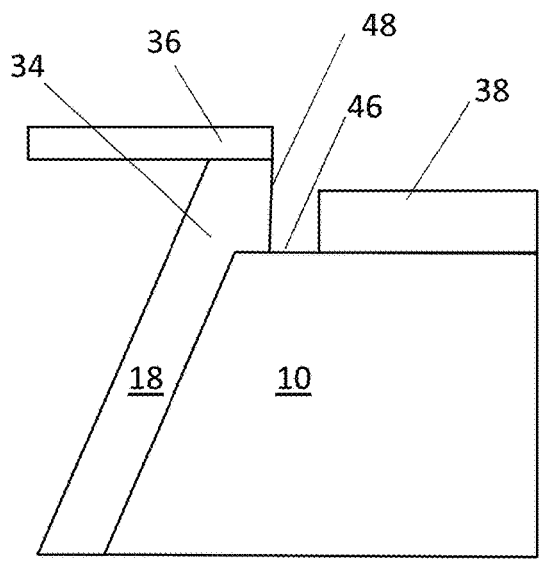
Figure 22B:
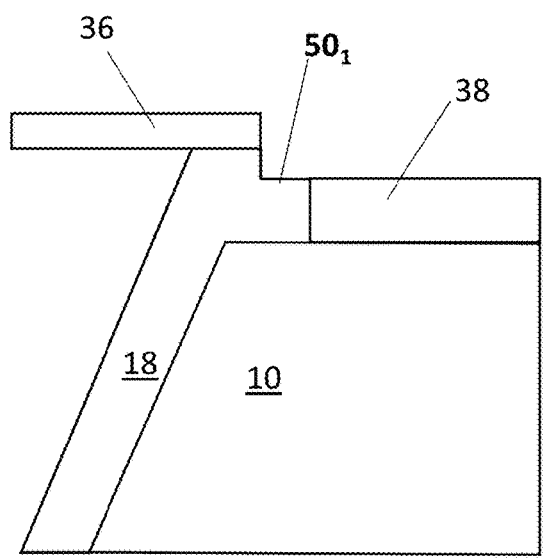
FIG. 22B is the cross-sectional view of FIG. 22A after metal has been deposited to form a step.

In some embodiments, as shown in FIG. 22A, step 420 includes forming an inner photoresist 36 and an outer photoresist 38 spaced apart from one another to leave a deposition surface 46 extending from an overburden additive edge 48 to the outer photoresist 38. As depicted in FIG. 22B, an additional step $50_1$ can then be added to the metallic layer 18 by depositing metal over the deposition surface 46 to a thickness less than the thickness of the metallic layer 18 adjacent to the additional step $50_1$.

Figure 23A:
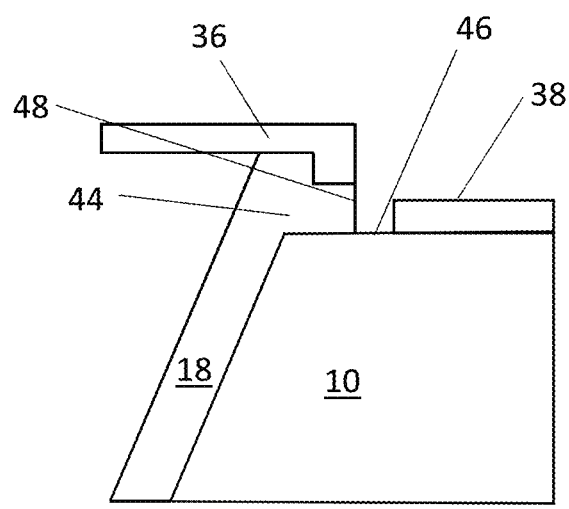
Figure 23B:
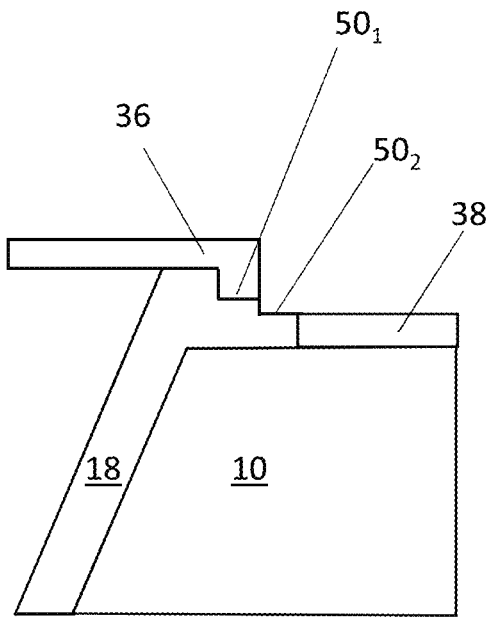
FIG. 23B is the cross-sectional view of FIG. 23A after metal has been deposited to form a subsequent step.

In process step 440, if more steps $50_n$ are desired, the step 420 of forming a new deposition surface 46 between an inner photoresist 36 and an outer photoresist and the step 430 of depositing metal over the deposition surface 46 are repeated, as shown in FIGS. 23A and 23B, respectively. Alternately, if no further steps $50_n$ are desired, the inner photoresist 36 and outer photoresist 38 can be removed. An example of the final first beveled overburden 20 produced by such a method is shown in FIG. 24.

Figure 20:
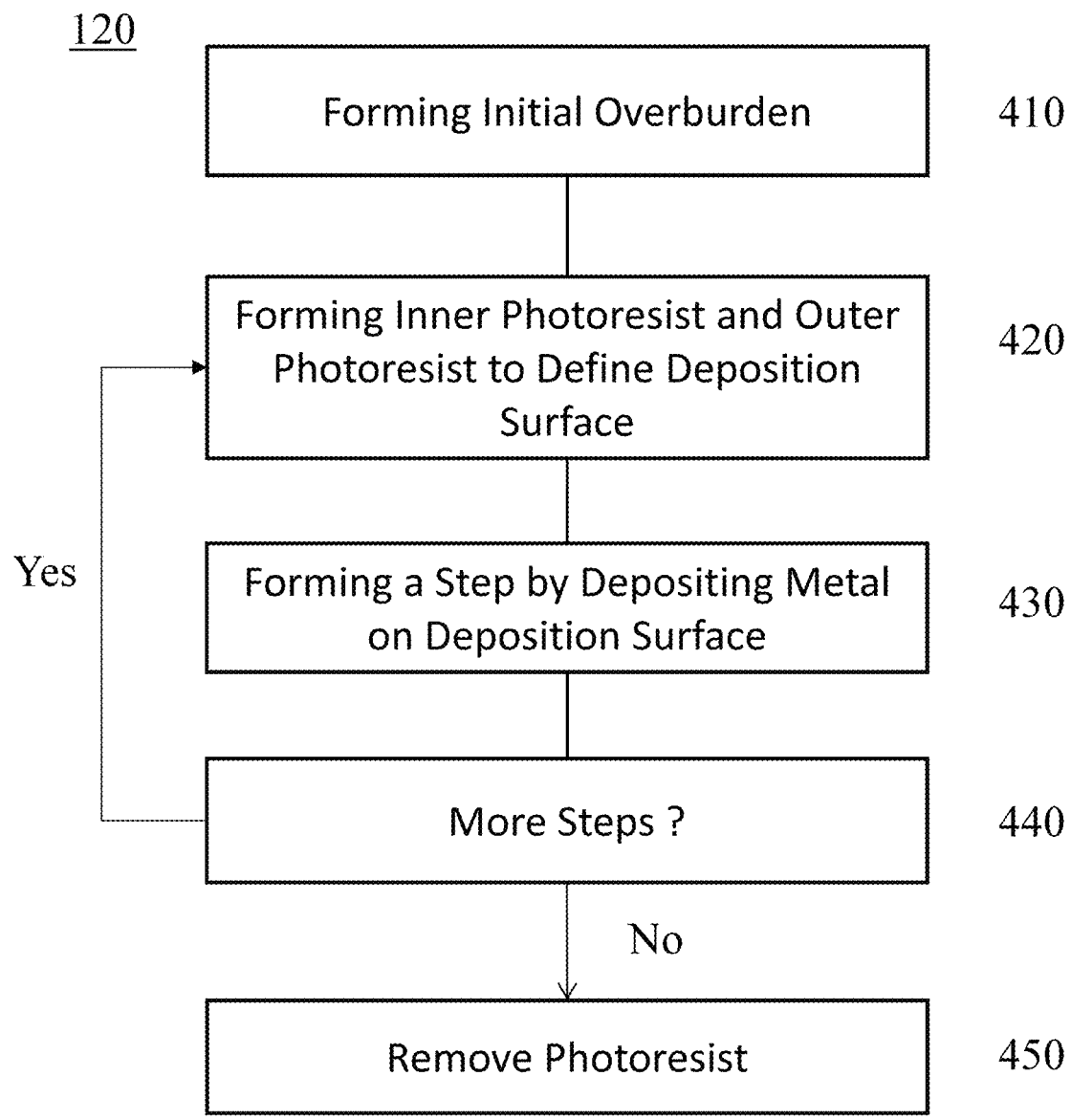
FIG. 20 is a flow chart of an additive method for forming a metallic layer with a stepped beveled overburden.
Figure 21A:
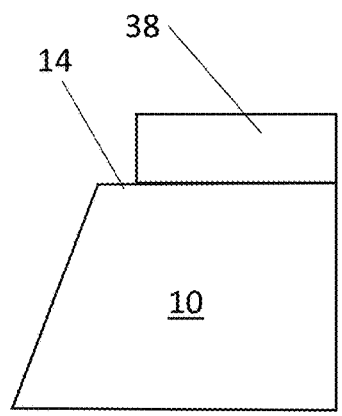
Figure 21B:
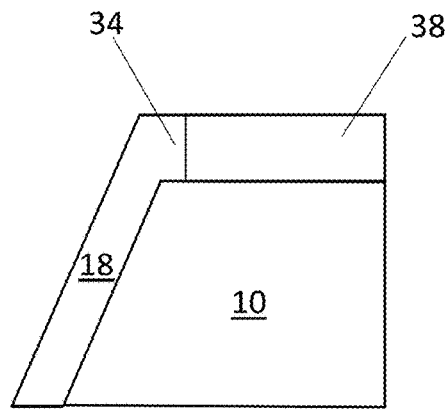
FIG. 21B is the cross-sectional view of FIG. 21A after an initial overburden has been deposited.

In some embodiments, the additive method of FIG. 20 can be performed on the second surface 16 of the substrate 10 to form a second beveled overburden 24. In some embodiments, the additive method is performed on the first surface 14 and the second surfaces 16 in parallel to form the first beveled overburden 20 and the second beveled overburden 24, simultaneously.

Experimental

Finite element modelling was used to assess the effect of the geometry of an overburden (e.g., a copper overburden) on induced substrate stresses (e.g., a glass substrate). Due to the symmetric nature of the metallized via (i.e., round), an axi-symmetric model was implemented. The outer diameters of the via ($\varnothing_{via}$) were modelled at 80 μm and the via waist diameter was modelled at 30 μm. Schematic examples of this geometry for a via with a conventional patterned overburden are shown in FIGS. 3A and 3B. As shown in FIG. 6, the length of the overburden away from the edge of the via was 20 μm. For the beveling of the Cu overburden, two concave bevels (FIGS. 7A and 7B) and a linear bevel (FIG. 7A) were studied. Both the steepness of the bevel, as well as the thickness of the overburden were parameters that were studied. The overburden was modelled as an elastic—plastic material (copper), while the glass substrate (Lotus NXT) was modelled as an elastic material. As part of the modelling, the structure was subjected to 600° C. annealing treatment and the reported results were after cooling down to room temperature.

FIGS. 3A and 3B show a patterned overburden in a through-hole via that ends abruptly 20 μm from the edge of the via. A three-dimensional graph of the calculated induced stresses in the substrate for the baseline patterned overburden situation is shown in FIG. 4. The location of high stress concentration in the glass was found to be at the region where the patterned overburden ended. It was determined that the stress levels experienced by the substrate with a via coated with a patterned overburden (480 MPa) were nearly 4 times the stress levels experienced the same substrate with an non-patterned overburden (125 MPa).

It has been determined that the stress levels experienced by the substrate can be greatly reduced by introducing an appropriate bevel to the outer edge of the overburden. This reduction in the stress levels reduces the likelihood the substrate (e.g., glass) will crack. FIGS. 7A, 7B, and 7C shows examples of linear and concave bevels analyzed in this study.

As can be seen in FIG. 6, beveling the patterned overburden results in a bevel angle (θ) between the outer edge of the overburden and the substrate that is greater than 90°. The study demonstrates that the reduced thickness of the overburden along the outer edge produces significant decreases in the magnitude of the peak stress along the edges of the patterned overburden.

FIG. 6 shows a schematic cross-section of a linear bevel configuration, highlighting the parameters that were studied in this work. In FIG. 6, parameter "a" is the region of the patterned overburden that is not beveled and parameter "b" is the length of the overburden that was beveled. As such, "a-b" is used to designate how the overburden was beveled. For instance, the designation 4-16 indicates that the initial 4 μm length of the overburden was not beveled, while the outer 16 μm of the overburden was beveled. The designation a-b can also be defined in terms of bevel angle (θ), which designates the steepness of the bevel. $OB_T$ is the thickness of the unbeveled portion of the overburden (OB) (e.g., the first lateral overburden surface 23). $OB_T$ was varied between 5 μm of 20 μm for this study. The full details of the parametric studies that was performed in this work are presented in Table 1.

TABLE 1

| OB Thick. = 5 μm a-b (θ°) | OB Thick. = 10 μm a-b (θ°) | OB Thick. = 20 μm a-b (θ°) |
|---|---|---|
| 20-0 (θ = 90°) | 20-0 (θ = 90°) | 20-0 (θ = 90°) |
| 18-2 (θ = 112°) | 14-6 (θ = 121°) | 14-6 (θ = 107°) |
| 15-5 (θ = 135) | 10-10 (θ = 135) | 8-12 (θ = 121°) |
| 2-18 (θ = 164) | 4-16 (θ = 148) | 2-18 (θ = 132°) |

Figure 8:
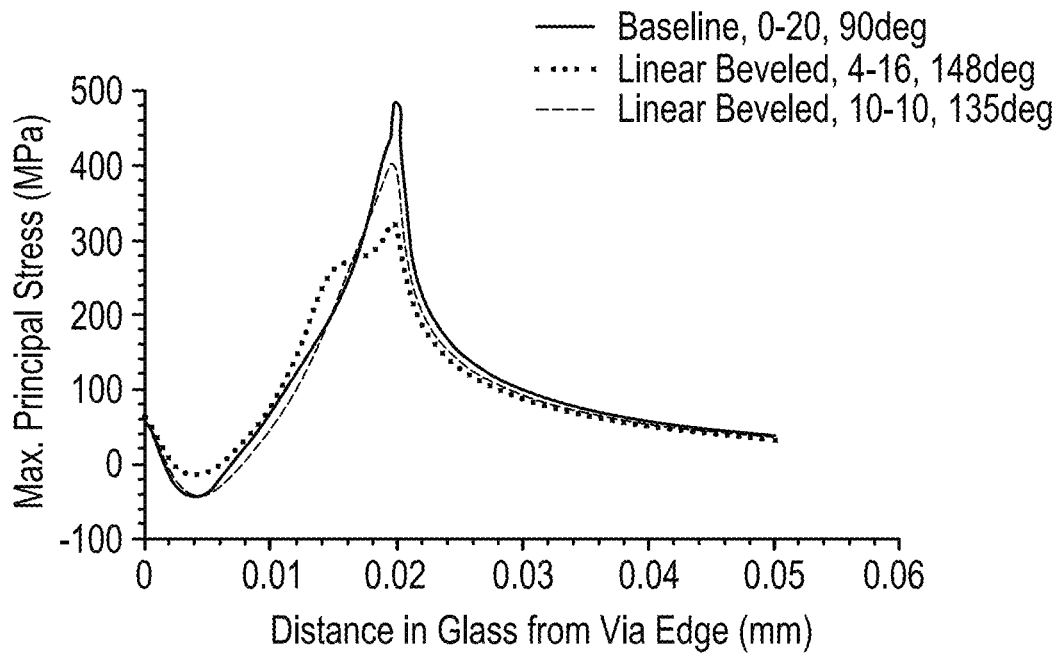
FIG. 8 is a graph of maximum principal stress versus distance from the edge of a via for an unbeveled patterned overburden and for two different linear, beveled overburdens.
Figure 9:
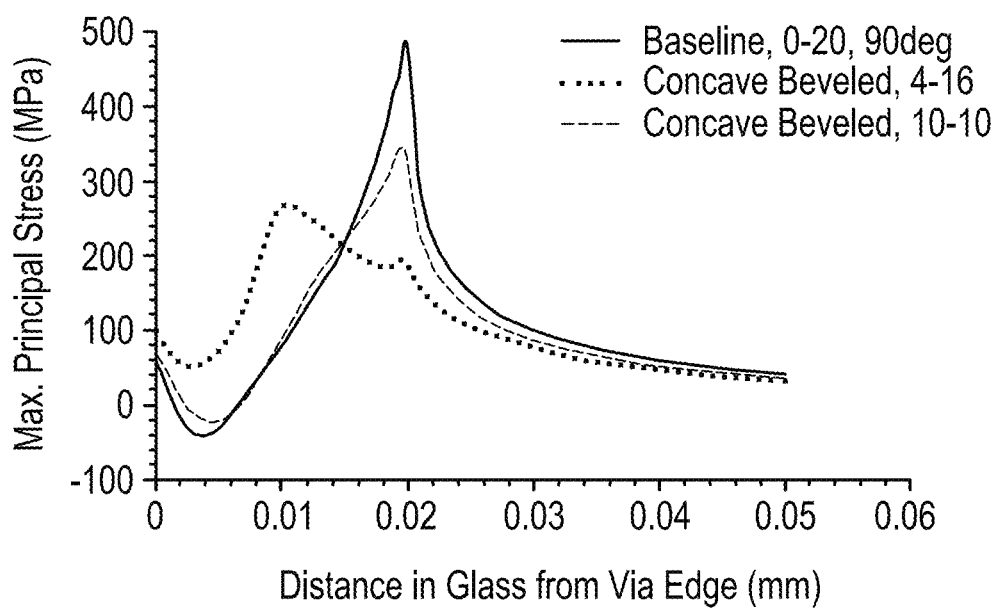
FIG. 9 is a graph of maximum principal stress versus distance from the edge of a via for an unbeveled patterned overburden and for two different concave, beveled overburdens.

Data was gathered for linear and concave bevels with an overburden thickness ($OB_T$) of 10 μm. FIG. 8 shows the calculated near surface glass stresses for an unbeveled overburden and two different linear beveled overburdens. FIG. 9 shows the calculated near surface substrate stresses for the unbeveled overburden and two concave beveled overburdens. The data show that beveling the overburden results in the reduction in the peak glass stresses that occurs along the edges of the patterned Cu overburden.

When the bevel is less steep (more gradual), having a bevel angle of 148° and "a-b" parameter of 4-16, the peak stress is much lower compared to when the beveling is steeper, having a bevel angle of 135° and "a-b" parameter of 10-10. For instance, as shown in FIG. 9, the peak glass stress for a less steep (4-16, 148°) concave bevel is 260 MPa, while the peak glass stress for a steeper (10-10, 135°) concave bevel is 320 MPa. Additionally, the less steep bevels (higher bevel angle) minimized stress concentration, which is evident from the broader stress peaks for the 4-16 bevels in both the linear bevel data (FIG. 8) and the concave bevel data (FIG. 9). In addition, the concave beveled patterned overburdens resulted in less stress than the linear beveled patterned overburdens.

Figure 10:
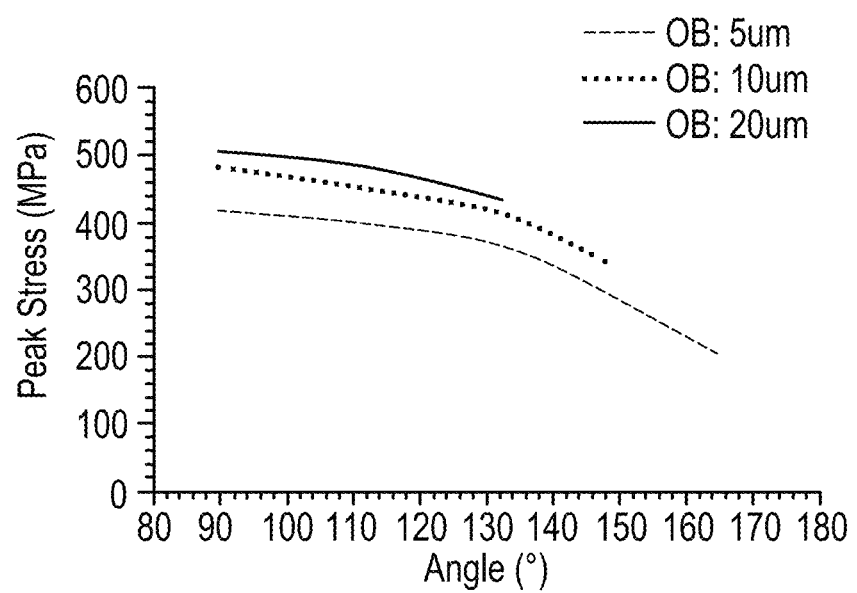
FIG. 10 is a graph of peak stress versus bevel angle for overburdens of different thicknesses.

To further analyze the role overburden and bevel angle on the magnitude of the peak stress in patterned overburden for the linear bevel configuration, a parametric FEA analysis was performed using the data points from Table 1. The predicted peak stress as a function of bevel angle and overburden thickness is presented in FIG. 10. This graph shows that thinner overburdens result in lower peak stresses along the overburden outer edge. Even more dramatic is the trend that increase in the bevel angle results in decreases in the peak stress. As shown in FIG. 10, once the bevel angle reaches or exceeds 120°, the decrease in peak stress versus bevel angle becomes non-linear. For instance, when the coper overburden is 5 μm thick, the drop in peak stresses from 90° to 120° is only about 40 MPa. However, for the same change in bevel angle (i.e., 30°), from 120° to 150°, the drop in the peak stress is 110 MPa. This represents about a three times greater drop in the peak stress compare to the stress reduction from 90° to 120°. Thus, bevel angles of 120° or greater produce even greater benefits than smaller bevel angles. For instance, bevel angles in range 120°≤θ≤175° can produce substantial decrease in peak stresses.

It will be apparent to those skilled in the art that various modifications and variations can be made to embodiments of the present disclosure without departing from the spirit and scope of the disclosure. Thus, it is intended that the present disclosure cover such modifications and variations provided they come within the scope of the appended claims and their equivalents.

What is claimed is:

1. A substrate, comprising:
   a first surface, a second surface opposite the first surface, and a via passing from the first surface to the second surface; and
   a metallic layer coating the via,
   wherein the metallic layer comprises a first beveled overburden on the first surface and the first beveled overburden comprises first outer edge,
   wherein the first outer edge forms a first bevel angle greater than 95° with the first surface,
   wherein the substrate exhibits a lower probability of crack formation when heated to temperatures less than or equal to 600° C. than a substrate having an equivalent metallic layer with a patterned overburden.

2. The substrate as claimed in claim 1, wherein the first bevel angle is 120° or greater.

3. The substrate as claimed in claim 1, wherein a maximum thickness of the first beveled overburden is less than 50 microns.

4. The substrate as claimed in claim 1, wherein the metallic layer comprises at least one of copper, aluminum, or tungsten.

5. The substrate as claimed in claim 1, wherein a length of the first beveled overburden on the first surface is less than 500 microns.

6. The substrate as claimed in claim 1, wherein the first outer edge comprises a linear bevel, stepped bevel, or concave bevel.

7. The substrate as claimed in claim 1, wherein the substrate comprises a material selected from glass, glass-ceramic, ceramics, silicon, quartz, sapphire and combinations thereof.

8. The substrate as claimed in claim 1, wherein the via is selected from a through hole via, a blind via, and a buried via.

9. The substrate as claimed in clam 1, wherein the substrate has a coefficient of thermal expansion of less than or equal to $10e^{-6}/°$ C.

10. The substrate as claimed in claim 1, wherein the via has a form selected from the group consisting of hour-glass, tapered, and cylindrical.

11. The substrate as claimed in claim 1, wherein the metallic layer is conformal over the via, pinched over the via, or fills the via.

12. The substrate as claimed in claim 1, wherein the metallic layer fills the via and a diameter of the via at the first surface is less than or equal to 25 microns.

13. The substrate as claimed in claim 1, wherein a length of a first lateral overburden surface is at least 1 micron.

14. The substrate as claimed in claim 1, wherein the metallic layer comprises a second beveled overburden on the second surface and the second beveled overburden comprises second outer edge.

15. The substrate as claimed in claim 14, wherein the second outer edge forms a second bevel angle greater than 95° with the second surface.

16. A method of forming a via, comprising:

forming a metallic layer with a first beveled overburden on a via, the via being formed in a substrate, the first beveled overburden disposed over a first surface of the substrate, and wherein the first beveled overburden comprises a first outer edge forming a first bevel angle greater than 95° with the first surface, wherein the depositing comprises:

depositing an initial overburden; and etching an outer portion of the initial overburden to form a first step.

17. The method as claimed in claim 16, wherein the forming comprises:

forming a photoresist mask with an undercut over the first surface; and depositing the metallic layer.

18. The method as claimed in claim 16, wherein the depositing further comprises:

etching a portion of the initial overburden adjacent to the first step to a thickness between a thickness of the first step and a thickness of the initial overburden to form a second step.

* * * * *